United States Patent [19]

Yoshida et al.

[11] 4,317,055
[45] Feb. 23, 1982

[54] HIGH-VOLTAGE CIRCUIT FOR INSULATED GATE FIELD-EFFECT TRANSISTOR

[75] Inventors: Isao Yoshida, Hinodemachi; Minoru Nagata, Kodaira; Shikayuki Ochi, Akishima; Hisao Katto, Hinodemachi, all of Japan

[73] Assignee: Hitachi, Ltd., Tokyo, Japan

[21] Appl. No.: 36,972

[22] Filed: May 8, 1979

[30] Foreign Application Priority Data

May 24, 1978 [JP] Japan ................................. 53-61057

[51] Int. Cl.³ .................. H03K 3/353; H03K 17/687; H03F 3/16; H01L 29/78
[52] U.S. Cl. ............................... 307/304; 307/296 R; 307/584; 330/277
[58] Field of Search ..................... 307/200 B, 251, 304, 307/296 R, 584; 330/277

[56] References Cited

U.S. PATENT DOCUMENTS 3,818,245  6/1974  Suzuki et al. .................... 307/304 X
3,986,060 10/1976  Nishizawa et al. ............. 330/277 X
4,100,438  7/1978  Yokoyama ...................... 330/277 X

OTHER PUBLICATIONS

"Cascode Field Effect Transistor Applications"; *Amelco Semiconductor;* Division of Teledyne, Inc.; Tech. Notes No. 5, pp. 1-14; 10/1963.

*Primary Examiner*—Larry N. Anagnos
*Attorney, Agent, or Firm*—Craig and Antonelli

[57] ABSTRACT

A high-voltage circuit for insulated gate field-effect transistors (MOSFETs) is provided wherein two MOSFETs are connected in series, the source and gate of the first MOSFET being respectively used as a source terminal and gate terminal of the high-voltage circuit, the drain of the second MOSFET being used as a drain terminal of the circuit. First and second resistors are connected in series between the source terminal and the drain terminal, and a biasing voltage supply is connected between the juncture of both the resistors and the gate of the second MOSFET. By virtue of these connections the "on" resistance of the high-voltage circuit is improved due to the effect of the biasing voltage effect in bringing the second MOSFET into an "on" condition.

12 Claims, 17 Drawing Figures

HIGH-VOLTAGE CIRCUIT FOR INSULATED GATE FIELD-EFFECT TRANSISTOR

BACKGROUND OF THE INVENTION (1) Field of the Invention

This invention relates to a high-voltage circuit for field-effect transistors, and more particularly to a high-voltage circuit for insulated gate field-effect transistors (hereinafter, briefly referred to as "MOSFETs").

(2) Description of the Prior Art

It has been known that by using a circuit as shown in FIG. 1, wherein two MOSFETs 1 and 2 are connected in a totem pole arrangement and wherein a voltage across both terminals 5 and 6 is divided by a resistance ratio, the apparent breakdown voltage can be made higher than in the single MOSFET.

If a series connection of the MOSFETs 1 and 2 is provided without the connection of resistors 3 and 4 shown in FIG. 1, when a voltage is applied across the terminals 5 and 6, the potential of a point 7 rises upon turning-on of the MOSFET 2, and the breakdown voltage across the terminals 5 and 6 is limited by the device breakdown voltage of the MOSFET 1. Upon turning-off of the MOSFET 2, a voltage is applied across the terminals 6 and 7, and the breakdown voltage across the terminals 5 and 6 is limited by the device breakdown voltage of the MOSFET 2.

Therefore, the resistors 3 and 4 are connected so as to make it possible to determine the potentials of terminals 7 and 8 by the resistance ratio. As a result, it is possible to select the resistances so that the breakdown voltage across the terminals 5 and 6 may become the sum of the breakdown voltages of the MOSFETs 1 and 2. That is, it is possible to control the potential of the terminal 7. Thus, a high breakdown voltage circuit is realized by the use of a plurality of MOSFETs.

With the circuit of FIG. 1, however, no current flows before the voltage across the terminals 7 and 8 becomes at least the threshold voltage $V_T$ of the MOSFET 2 in order to turn this MOSFET "on", so that the rise characteristics are inferior.

That is, the high breakdown voltage of the circuit in FIG. 1 is achieved on the ground that the potential of the terminal 8 is determined by the ratio of the resistances 3 and 4, while the potential of the terminal 7 is fixed. On the other hand, the rise of the current—voltage characteristics (called the "on-resistance") of the circuit is very inferior because current does not flow until the MOSFET 2 turns "on" owing to the potential difference across the terminals 7 and 8.

Regarding a single MOSFET shown in FIG. 2, current—voltage characteristics across terminals 5' and 6' at the time when the voltage of a gate 9'−5 V are shown in FIG. 3A, and current—voltage characteristics at the time when the gate voltage is varied are shown in FIG. 3B. Regarding the circuit of FIG. 1, the current—voltage characteristics across the terminals 5 and 6 at the time when a gate voltage (the voltage of a terminal 9) is −5 V are shown in FIG. 4A, and the current—voltage characteristics at the time when the gate voltage is varied are shown in FIG. 4B. As is apparent from FIGS. 3A, 3B, 4A and 4B, with the circuit of FIG. 1, the breakdown voltage is increased (enhanced from 200 V to 400 V), but the current—voltage characteristics in the case of varying the gate voltage are degraded. This indicates that the on-resistance is increased in the circuit form of FIG. 1.

In FIGS. 1 and 2, the MOSFETs 1, 2 and 1' are N-channel MOSFETs of the enhancement mode.

SUMMARY OF THE INVENTION

An object of this invention is to provide an improved circuit which reduces the on-resistance of the prior-art high-voltage MOSFET circuit based on the totem pole connection as described above.

According to this invention, in the circuit of FIG. 1, the MOSFET 2 is readily brought into the "on" state or is normally held in the "on" state in such a way that the gate of the MOSFET 2 is biased by means of a bias circuit or bias voltage supply or that the MOSFET 2 is made a MOSFET of the depletion mode.

Whether the MOSFET 1 is of the enhancement mode or of the depletion mode, this invention is effective. However, when it is of the enhancement mode, the invention is more effective. But even when the MOSFET 2 is of the depletion mode, its gate may be biased, whereby the invention becomes more effective.

DESCRIPTION OF THE PREFERRED EMBODIMENTS

Hereunder, this invention will be described in detail along embodiments.

Figure 5:
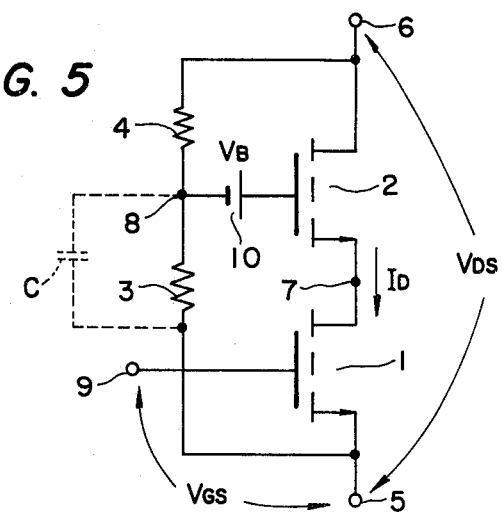
FIG. 5 is a diagram showing an embodiment of a high-voltage circuit for MOSFETs according to this invention.

Embodiment 1:

A circuit of a first embodiment of this invention is shown in FIG. 5. In the figure, a MOSFET 1 and another MOSFET 2 are connected in the totem pole type namely, and a voltage across the source terminal 5 of the MOSFET 1 and the drain terminal 6 of the MOSFET 2 is divided by resistors 3 and 4 with the center at the gate terminal 8 of the MOSFET 2. Thus, the breakdown voltage of a circuit composed of the terminals 6 and 5 and a gate terminal 9 is observed as the sum between the breakdown voltage of the MOSFET 1 and that of the MOSFET 2. As previously stated, however, the on-resistance of this circuit becomes the sum between the on-resistance of the MOSFET 1 and that of the MOSFET 2 or greater when only the dividing resistors are employed. Therefore, a bias voltage supply 10 which forward-biases the gate of the MOSFET 2 is inserted. As this bias voltage supply, one having at least the threshold voltage of the MOSFET 2 may be employed, and one of a higher voltage is better.

By biasing the gate of the MOSFET 2 as stated above, the "on" resistance component of the MOSFET 2 can be reduced, and the "on" resistance of the present circuit can be reduced. Especially in a case where the two MOSFETs of the MOSFET 1 and the MOSFET 2 are of the enhancement mode, the "on" resistance is great because no current flows till turning-on of the MOSFET 2, and hence, the effect according to the present circuit is remarkable. The lowering of the breakdown voltage of the present circuit attributed to the insertion of the bias voltage supply 10 is hardly noted. By adding a capacitance C, the switching characteristics of the MOSFET 2 are effectively improved.

Figure 1:
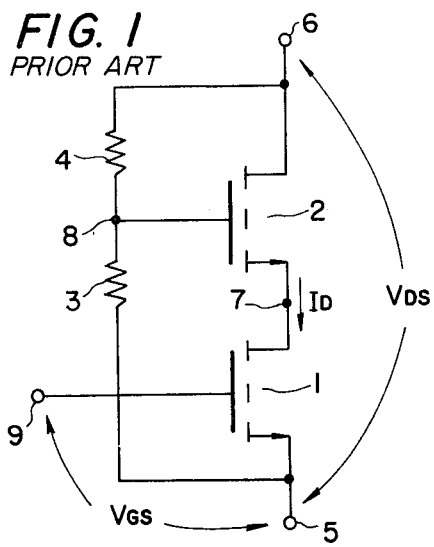
FIG. 1 is a diagram showing a prior-art MOSFET totem pole connection circuit.
Figure 2:
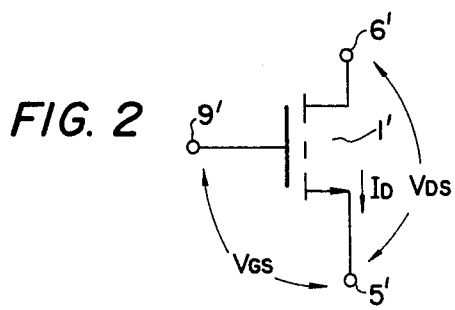
FIG. 2 is a diagram showing a single MOSFET.
Figure 3A:
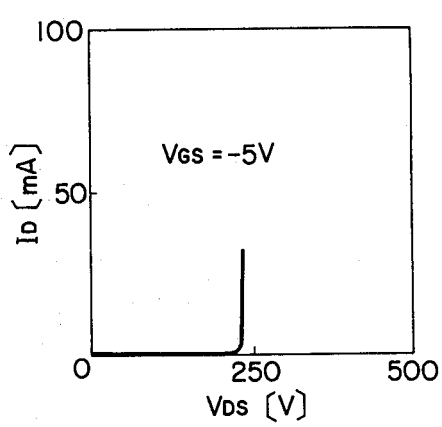
FIGS. 3A and 3B are graphs showing current-voltage characteristics of the single MOSFET in FIG. 2.
Figure 3B:
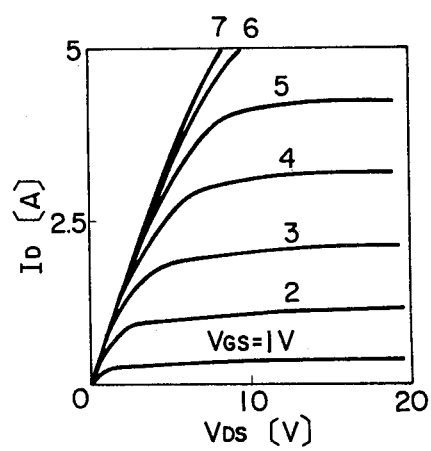
Figure 4A:
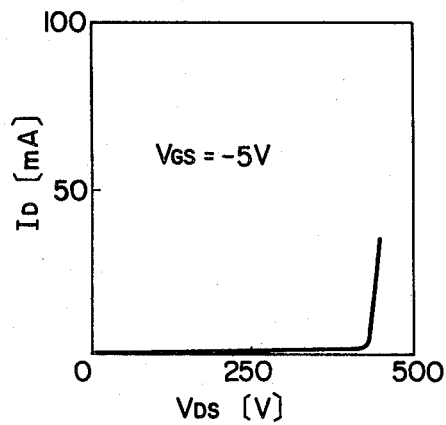
FIGS. 4A and 4B are graphs showing current-voltage characteristics of the circuit in FIG. 1.
Figure 4B:
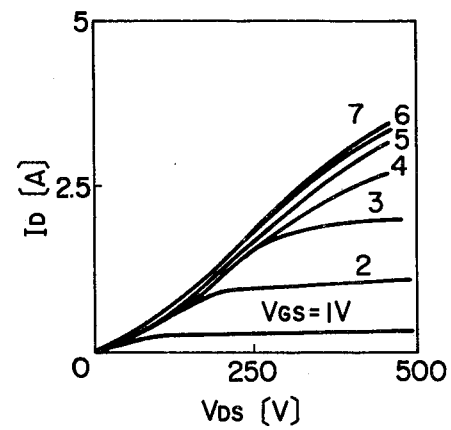
Figure 6:
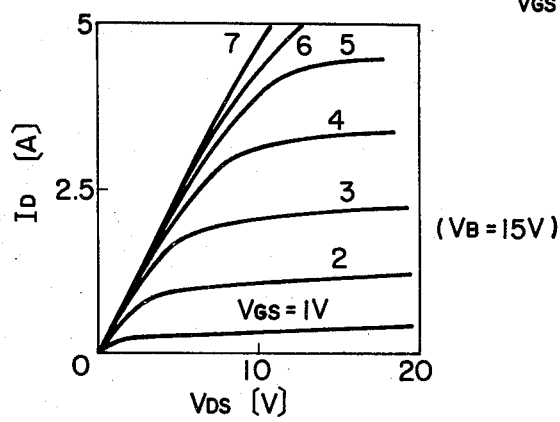
FIG. 6 is a graph showing current-voltage characteristics of the circuit in FIG. 5 at the time when a gate voltage is varied.

The effect of the present circuit is as follows in terms of characteristics. As described previously, FIGS. 4A and 4B show the voltage-current characteristics of the prior-art circuit, and the rise is inferior. On the other hand, FIG. 6 shows the characteristics of the present circuit, and it is clearly understood that the rise characteristics are remarkably improved. The characteristics in FIG. 6 correspond to a case where the resistors 3 and 4 are of 150 KΩ, the bias voltage supply 10 is of 15 V and the MOSFETs 1 and 2 are MOSFETs "2SK134" of Hitachi Ltd. This fact is quantitatively indicated by the "on" resistance as follows. When $V_{GS}=10$ V and $I_D=4$ A, the "on" resistance is 4.6 Ω with the circuit of FIG. 1, and it is 2.2 Ω according to this invention. Therefore, the invention permits cutting the "on" resistance approximately in half, which is a very significant improvement. In both the cases, the breakdown voltages are about 400 V.

Although, in the present embodiment, the bias voltage supply 10 is employed in order to bias the MOSFET 2, the same effect as in the present embodiment can be attained by other methods.

Embodiment 2:

As a second embodiment, the MOSFET 2 is made a device which is equivalently biased, that is, a device whose threshold voltage is lower than that of the MOSFET 1 is employed (for example, a depletion mode MOSFET is employed). The biasing system in Embodiment 1 may well be jointly used.

Figure 7:
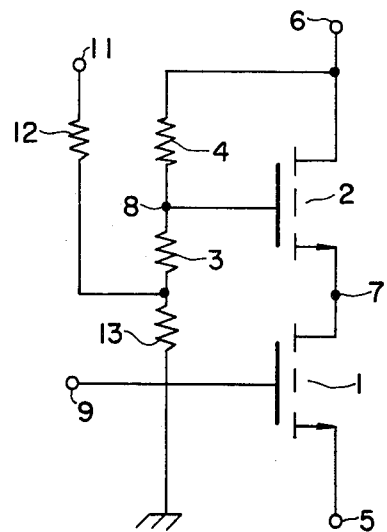
FIG. 7, FIG. 8, FIG. 9, FIG. 10 and FIG. 11 are diagrams each showing another embodiment of the high-voltage circuit for MOSFETs according to this invention.

Embodiment 3:

As a third embodiment, the bias voltage supply 10 is replaced with a circuit as shown in FIG. 7 according to which the terminal 8 illustrated in FIG. 5 can be biased with an external voltage supply.

In FIG. 7, the bias is given by the resistance division, and numeral 11 designates a bias voltage supply terminal and numerals 12 and 13 designate bias resistors. By way of example, under the same conditions as in Embodiment 1, a voltage of 100 V may be applied to the terminal 11, and resistances of 90 KΩ and 10 KΩ may be employed for the respective resistors 12 and 13.

Other biasing systems than that shown in the circuit of FIG. 7 are illustrated in FIGS. 8, 9, 10 and 11.

Figure 8:
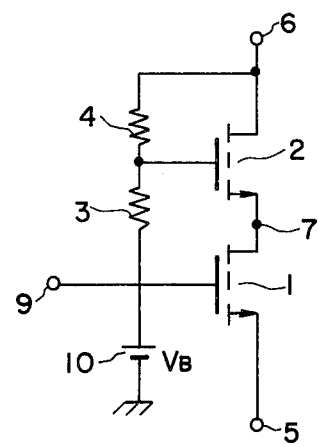

In FIG. 8, the position of the bias voltage supply 10 is changed.

Figure 9:
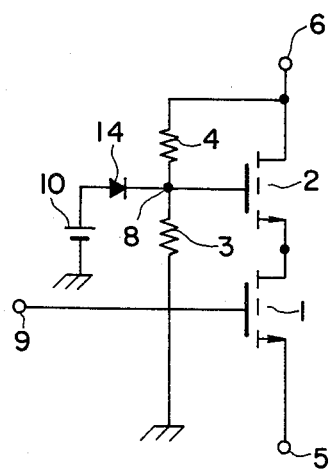

In FIG. 9, the bias voltage supply 10 and a diode 14 are connected to the terminal 8.

Figure 10:
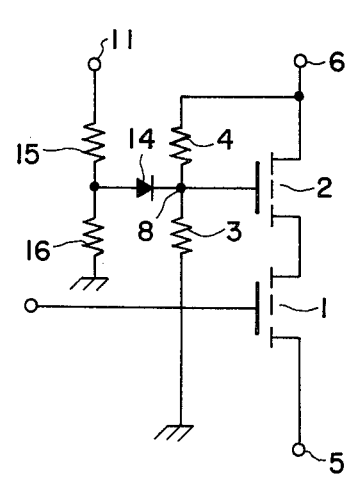

According to the biasing system of FIG. 10, a resistance-division bias is given by resistors 15 and 16 in the system of FIG. 9.

Figure 11:
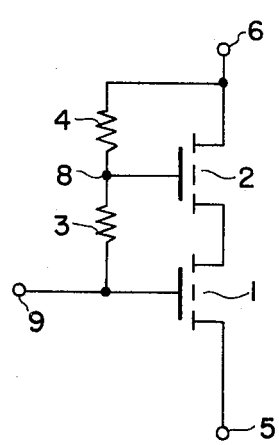

In FIG. 11, a bias is given from the gate terminal 9.

Figure 12:
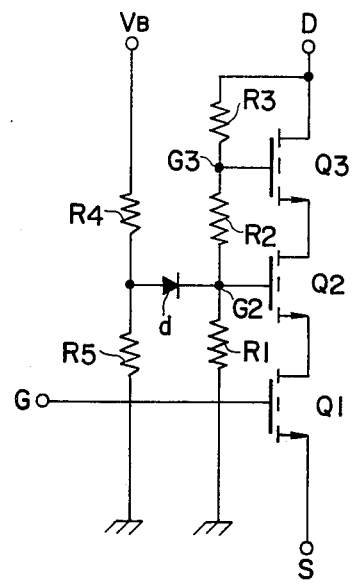
FIG. 12 is a diagram showing another embodiment of this invention which is a totem pole connection circuit employing three MOSFETs.

Embodiment 4:

FIG. 12 shows an embodiment of this invention in which three MOSFETs are connected in the totem pole type arrangement. Referring to the figure, MOSFETs Q1, Q2 and Q3 are connected in series, and the gates G2 and G3 of the respective MOSFETs Q2 and Q3 are biased from a bias voltage supply terminal $V_B$ by the resistance-division biasing owing to resistors R1, R2, R3, R4 and R5. d indicates a diode, G indicates the gate terminal of the MOSFET Q1 functioning as a gate terminal of the present circuit, and D and S indicate a drain terminal and a source terminal of the circuit respectively.

Figure 13:
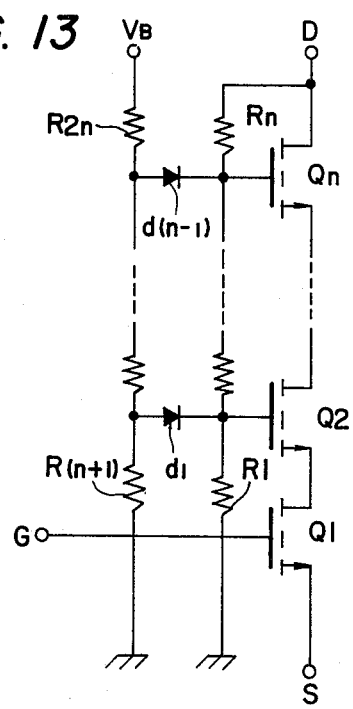
FIG. 13 is a diagram showing still another embodiment of this invention which is a totem pole connection circuit employing n MOSFETs.

Now, FIG. 13 shows an embodiment of this invention in which n MOSFETs are connected in the totem pole type arrangement. Referring to the figure, Q1-Qn indicate MOSFETs; R1-R2n resistors; d1-d(n-1) diodes; G, D and S gate, drain and source terminals of the present circuit, respectively; and $V_B$ a bias voltage supply terminal.

Figure 14:
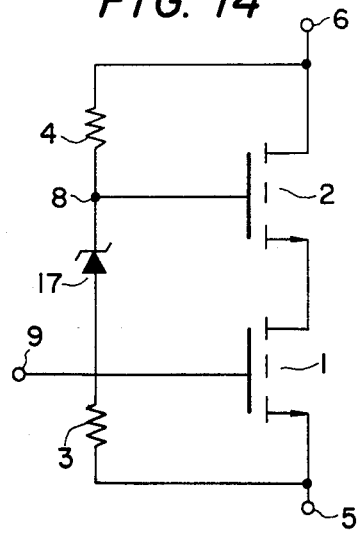
FIG. 14 is a diagram showing a further embodiment of this invention which is a circuit biased with a Zener diode.

Embodiment 5:

FIG. 14 shows a fifth embodiment of this invention.

To a MOSFET 1 having a drain breakdown voltage of 220 V, another MOSFET 2 having the same extent of breakdown voltage is connected in the totem pole type arrangement. A voltage across a source terminal 5 of the MOSFET 1 and a drain terminal 6 of the MOSFET 2 is divided with resistors 3 and 4 of 150 KΩ with the center at a gate terminal 8 of the MOSFET 2. As a result, the breakdown voltage of a circuit composed of the terminals 5 and 6 and a gate terminal 9 of the MOSFET 1 becomes the sum between the breakdown voltage of the MOSFET 1 and that of the MOSFET 2 or 440 V. Simultaneously, the "on" resistance of the circuit becomes greater than the sum between the "on" resistance of the MOSFET 1 and that of the MOSFET 2 because the MOSFET 2 has a positive threshold voltage. Therefore, a Zener diode 17 having a breakdown voltage of 10 V is inserted. Thus, if an applied voltage to the terminal 6 is low, the Zener diode blocks current and therefore raises the potential of the terminal 8 to prevent the "on" resistance from rising. If the applied voltage is high, the Zener diode turns "on" and permits current to flow and holds the potential of the terminal 8 substantially medium, thereby serving to make the voltage of the circuit about 440 V.

The present embodiment consists in that an impedance element having a threshold value such as the Zener diode is incorporated in the prior-art totem pole circuit. It is apparent that, according to the form of FIG. 14, the rise characteristics of the circuit are improved. When the improvement is quantitatively indicated in terms of the "on" resistance, the "on" resistance is 4.6 Ω in the prior art, whereas it becomes 2.8 Ω in this invention, so that it can be diminished about 70%.

Figure 15:
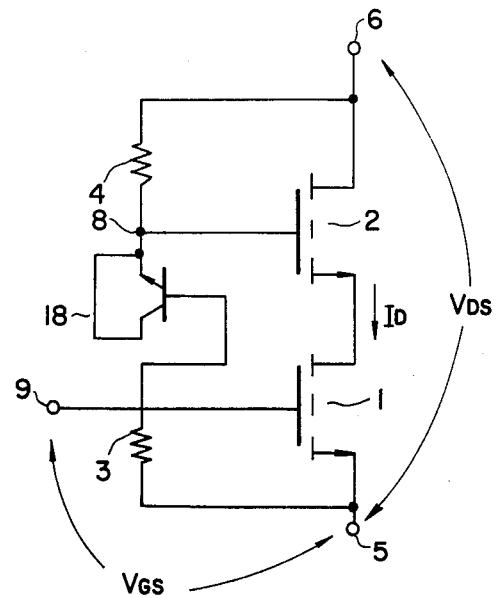
FIG. 15 is a diagram showing a still further embodiment which is a circuit biased with a junction of a bipolar transistor.
Figure 16:
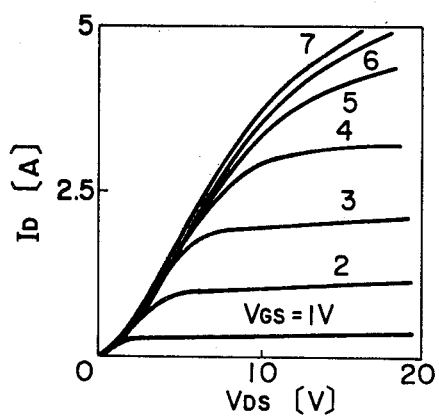
FIG. 16 is a graph showing current-voltage characteristics of the circuit in FIG. 15 at the time when a gate voltage is varied.
Figure 17:
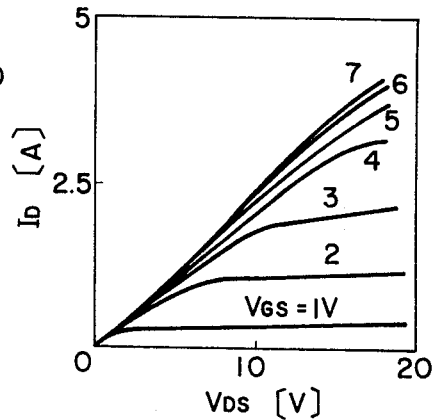
FIG. 17 is a graph showing current-voltage characteristics at the time when a gate voltage is varied in a high breakdown voltage circuit of this invention which is biased by four forward-connected diodes that serve as an impedance element having a threshold value.

Although, in the present embodiment, the Zener diode is employed as the impedance element having a threshold value, it is possible to utilize a junction in a conventional bipolar transistor as the impedance element 17 having a threshold value as illustrated at 18 in FIG. 15, and a plurality of diodes may be used as well. As regards a connection method for utilizing the transistor junction or the diodes, either the forward direction or the reverse direction may be resorted to, but the reverse connection is more effective. FIG. 16 shows current-voltage characteristics at the time when the gate voltage is varied in the circuit of FIG. 15 exploiting the transistor junction, while FIG. 17 shows current-voltage characteristics at the time when a gate voltage is varied in a circuit including four diodes connected in the forward direction.

A feature of the present circuit is that the measure can be performed very simply without being restricted by any other circuit part.

In the foregoing embodiments, the N-channel type enhancement MOSFETs have been chiefly referred to. However, this invention is also applicable to P-channel type MOSFETs by changing the polarities of a power supply, etc. And, as noted previously the invention is also effective when applied to depletion MOSFETs.

What is claimed is:

1. A high-voltage MOSFET (insulated gate field-effect transistor) circuit wherein n MOSFETs are connected in series by electrically connecting a drain of the m-th ($1 \leq m \leq n-1$) MOSFET and a source of the (m+1)-th MOSFET, a source and gate of the first MOSFET being respectively used as a source terminal and gate terminal of the MOSFET circuit, a drain of the n-th MOSFET being used as a drain terminal of the MOSFET circuit, and wherein divided voltages obtained by dividing a voltage applied across the source and drain terminals, by means of a first voltage divider circuit in which a plurality of resistors are connected in series are applied to gates of the second to n-th MOSFETs; the high-voltage MOSFET circuit being characterized by comprising means for holding the second to n-th MOSFETs in an "on" state by applying bias voltages from a bias voltage supply to the respective gates of said second to n-th MOSFETs.

2. A high-voltage circuit for MOSFETs according to claim 1, wherein said means for applying bias voltages comprise bias voltage supply means electrically connected between said respective gates of said second to n-th MOSFETs and connection nodes of said resistors of said first voltage divider circuit.

3. A high-voltage circuit for MOSFETs according to claim 1, wherein said bias voltage supply means is connected to said gates through rectifiers.

4. A high-voltage circuit for MOSFETs according to claim 1, wherein said means for applying bias voltages is a circuit which divides a voltage fed from a bias voltage supply terminal, by means of a second voltage divider circuit with a plurality of resistors connected in series and which applies the divided voltages to said respective gates as said bias voltages.

5. A high-voltage circuit for MOSFETs according to claim 4, wherein one of connection nodes of said resistors of said second voltage divider circuit is connected to an end of said first voltage divider circuit.

6. A high-voltage circuit for MOSFETs according to claim 4, wherein connection nodes of said resistors of said second voltage divider circuit are connected to said respective gates of said second to n-th MOSFETs through rectifiers.

7. A high-voltage circuit for MOSFETs according to claim 1, wherein an impedance element having a threshold value is inserted between the adjacent resistors of said first voltage divider circuit, whereby said bias voltages are applied to said respective gates of said second to n-th MOSFETs.

8. A high-voltage circuit for MOSFETs according to claim 7, wherein said impedance element having a threshold value is a Zener diode.

9. A high-voltage circuit for MOSFETs according to claim 8, wherein said impedance element having a threshold value is a diode-coupled bipolar transistor.

10. A high-voltage MOSFET (insulated gate field-effect transistor) circuit wherein n MOSFETs are connected in series by electrically connecting a drain of the m-th ($1 \leq m \leq n-1$) MOSFET and a source of the (m+1)-th MOSFET, a source and gate of the first MOSFET being respectively used as a source terminal and gate terminal of the MOSFET circuit, a drain of the n-th MOSFET being used as a drain terminal of the MOSFET circuit, and wherein divided voltages obtained by dividing a voltage applied across the source and drain terminals, by means of a first voltage divider circuit in which a plurality of resistors are connected in series are applied to gates of the second to n-th MOSFETs; the high-voltage MOSFET circuit being characterized by comprising means for applying bias voltages from a bias voltage supply to the respective gates of said second to n-th MOSFETs, wherein said bias voltage supply means is connected to said gates through rectifiers.

11. A high-voltage MOSFET (insulated gate field-effect transistor) circuit wherein n MOSFETs are connected in series by electrically connecting a drain of the m-th ($1 \leq m \leq n-1$) MOSFET and a source of the (m+1)-th MOSFET, a source and gate of the first MOSFET being respectively used as a source terminal and gate terminal of the MOSFET circuit, a drain of the n-th MOSFET being used as a drain terminal of the MOSFET circuit, and wherein divided voltages obtained by dividing a voltage applied across the source and drain terminals, by means of a first voltage divider circuit in which a plurality of resistors are connected in series are applied to gates of the second to n-th MOSFETs; the high-voltage MOSFET circuit being characterized by comprising means for applying bias voltages from a bias voltage supply to the respective gates of said second to n-th MOSFETs, wherein said means for applying bias voltages is a circuit which divides a voltage fed from a bias voltage supply terminal, by means of a second voltage divider circuit with a plurality of resistors connected in series and which applies the divided voltages to said respective gates as said bias voltages.

12. A high-voltage MOSFET (insulated gate fieldeffect transistor) circuit wherein n MOSFETs are connected in series by electrically connecting a drain of the m-th ($1 \leq M \leq n-1$) MOSFET and a source of the (m+1)-th MOSFET, a source and gate of the first MOSFET being respectively used as a source terminal and gate terminal of the MOSFET circuit, a drain of the n-th MOSFET being used as a drain terminal of the MOSFET circuit, and wherein divided voltages obtained by dividing a voltage applied across the source and drain terminals, by means of a first voltage divider circuit in which a plurality of resistors are connected in series are applied to gates of the second to n-th MOSFETs; the high-voltage MOSFET circuit being characterized by comprising means for applying bias voltages from a bias voltage supply to the respective gates of said second to n-th MOSFETs, wherein an impedance element having a threshold value is inserted between the adjacent resistors of said first voltage divider circuit, whereby said bias voltages are applied to said respective gates of said second to n-th MOSFETS.

* * * * *